(12) United States Patent
Abe et al.

(10) Patent No.: US 9,119,336 B2
(45) Date of Patent: Aug. 25, 2015

(54) BONDING STRUCTURE MANUFACTURING METHOD, HEATING AND MELTING TREATMENT METHOD, AND SYSTEM THEREFOR

(71) Applicants: Hideyuki Abe, Himeji (JP); Kazuaki Mawatari, Oita (JP)

(72) Inventors: Hideyuki Abe, Himeji (JP); Kazuaki Mawatari, Oita (JP)

(73) Assignee: AYUMI INDUSTRY CO., LTD., Himeji-Shi, Hyogo (JP)

( * ) Notice: Subject to any disclaimer, the term of this patent is extended or adjusted under 35 U.S.C. 154(b) by 0 days.

(21) Appl. No.: 14/275,153

(22) Filed: May 12, 2014

(65) Prior Publication Data

US 2014/0246481 A1    Sep. 4, 2014

Related U.S. Application Data

(62) Division of application No. 13/806,907, filed as application No. PCT/JP2011/064532 on Jun. 24, 2011, now Pat. No. 8,757,474.

(30) Foreign Application Priority Data

Jun. 28, 2010 (JP) ................. 2010-146337
Jul. 23, 2010 (JP) ................. 2010-166448

(51) Int. Cl.
*B23K 31/02* (2006.01)
*H05K 13/04* (2006.01)
(Continued)

(52) U.S. Cl.
CPC ............ *H05K 13/0465* (2013.01); *B23K 1/008* (2013.01); *B23K 1/0016* (2013.01); *B23K 1/20* (2013.01); *B23K 1/206* (2013.01); *B23K 31/02* (2013.01); *H01L 24/13* (2013.01); *H01L 24/16* (2013.01); *H01L 24/75* (2013.01); *H01L 24/81* (2013.01); *B23K 2201/40* (2013.01);
(Continued)

(58) Field of Classification Search
None
See application file for complete search history.

(56) References Cited

U.S. PATENT DOCUMENTS 5,234,149 A    8/1993 Katz et al.
6,010,577 A    1/2000 Bristol et al.
(Continued)

FOREIGN PATENT DOCUMENTS

CN    101393953 A    3/2009
EP    0628370 A    12/1994
(Continued)

OTHER PUBLICATIONS

Official Action for Decision of Refusal dated Oct. 7, 2014 issued by the Japanese Patent Office in Priority Japanese Patent Application No. 2010-166448.
(Continued)

*Primary Examiner* — Kiley Stoner
(74) *Attorney, Agent, or Firm* — Porzio, Bromberg & Newman, P.C.

(57) ABSTRACT

A soldering method capable of alleviating positional displacement between substrates even though a step of removing flux can be omitted is provided.
A temporary bonding agent 55 is applied onto multiple substrates 50a, 50b, and a heater 33 heats the substrates while the substrates are temporarily bonded with the temporary bonding agent 55 interposed therebetween, and before the solder 54 is melted or while the solder 54 is melted, the temporary bonding agent 55 is evaporated, and the substrates 50a, 50b are bonded with solder with the melted solder 54 interposed therebetween.

5 Claims, 9 Drawing Sheets

(51) Int. Cl.
 *B23K 1/20* (2006.01)
 *B23K 1/00* (2006.01)
 *B23K 1/008* (2006.01)
 *H01L 23/00* (2006.01)

(52) U.S. Cl.
 CPC ............... *H01L2224/1308* (2013.01); *H01L 2224/13082* (2013.01); *H01L 2224/13083* (2013.01); *H01L 2224/13111* (2013.01); *H01L 2224/13116* (2013.01); *H01L 2224/13155* (2013.01); *H01L 2224/13164* (2013.01); *H01L 2224/16225* (2013.01); *H01L 2224/16227* (2013.01); *H01L 2224/32225* (2013.01); *H01L 2224/73204* (2013.01); *H01L 2224/7515* (2013.01); *H01L 2224/75101* (2013.01); *H01L 2224/75272* (2013.01); *H01L 2224/81002* (2013.01); *H01L 2224/8109* (2013.01); *H01L 2224/81011* (2013.01); *H01L 2224/81014* (2013.01); *H01L 2224/81019* (2013.01); *H01L 2224/81054* (2013.01); *H01L 2224/81193* (2013.01); *H01L 2224/81211* (2013.01); *H01L 2224/81805* (2013.01); *H01L 2224/81815* (2013.01); *H01L 2224/81907* (2013.01); *H01L 2224/83104* (2013.01)

(56) References Cited

U.S. PATENT DOCUMENTS

| | | | |
|---|---|---|---|
| 6,193,812 | B1 | 2/2001 | Bristol et al. |
| 6,228,681 | B1 | 5/2001 | Gilleo et al. |
| 6,344,407 | B1* | 2/2002 | Matsuki et al. ............... 438/613 |
| 6,367,150 | B1 | 4/2002 | Kirsten |
| 6,429,516 | B1 | 8/2002 | Tsunoi |
| 6,550,665 | B1 | 4/2003 | Parrish et al. |
| 6,590,287 | B2 | 7/2003 | Ohuchi |
| 6,648,213 | B1 | 11/2003 | Patterson et al. |
| 6,796,481 | B2 | 9/2004 | Yamauchi |
| 6,911,624 | B2 | 6/2005 | Koopmans |
| 6,975,036 | B2 | 12/2005 | Ohuchi |
| 7,703,658 | B2 | 4/2010 | Gormley et al. |
| 7,735,713 | B2 | 6/2010 | Kataoka et al. |
| 7,951,700 | B2 | 5/2011 | Kitae et al. |
| 8,017,875 | B2 | 9/2011 | Kawamura et al. |
| 2002/0076909 | A1 | 6/2002 | Matsuki et al. |
| 2002/0130164 | A1* | 9/2002 | Matsuki et al. ............... 228/206 |
| 2004/0072387 | A1 | 4/2004 | Hong et al. |
| 2004/0104261 | A1 | 6/2004 | Sterrett et al. |
| 2004/0129344 | A1* | 7/2004 | Arita et al. .................... 148/23 |
| 2006/0128834 | A1 | 6/2006 | Chen et al. |
| 2007/0086147 | A1 | 4/2007 | Kawamura et al. |
| 2008/0000549 | A1 | 1/2008 | Sheng et al. |
| 2008/0244900 | A1 | 10/2008 | Maeda et al. |
| 2009/0137082 | A1* | 5/2009 | Kurita ............................ 438/106 |
| 2010/0170939 | A1* | 7/2010 | Ishikawa ....................... 228/220 |
| 2010/0320258 | A1* | 12/2010 | Sawada et al. ............ 228/180.22 |
| 2011/0297433 | A1* | 12/2011 | Kuramoto et al. ............. 174/263 |
| 2012/0039056 | A1 | 2/2012 | Oppermann et al. |
| 2012/0168219 | A1* | 7/2012 | Kitamura et al. .............. 174/263 |
| 2012/0305632 | A1 | 12/2012 | Ross et al. |
| 2013/0075455 | A1* | 3/2013 | Shimizu ........................ 228/256 |
| 2013/0105558 | A1 | 5/2013 | Abe et al. |
| 2013/0234317 | A1 | 9/2013 | Chen et al. |

FOREIGN PATENT DOCUMENTS

| | | |
|---|---|---|
| JP | 06236449 A | 11/1994 |
| JP | 08242069 A | 9/1996 |
| JP | 11233934 A | 8/1999 |
| JP | 2001244618 A | 9/2001 |
| JP | 2002-210555 A | 7/2002 |
| JP | 2008041980 A | 2/2008 |
| JP | 2009248114 A | 10/2009 |
| JP | 2010087277 A | 4/2010 |
| JP | 2011121102 A | 6/2011 |
| TW | 200536652 | 11/2005 |
| TW | 200718298 | 5/2007 |
| WO | 2007004658 A1 | 1/2007 |

OTHER PUBLICATIONS

Office Action dated Jan. 12, 2015 issued by the China Intellectual Property Office in corresponding Chinese Patent Application No. 201180031174.9.

Office Action dated Mar. 2, 2015 issued by the Taiwanese Intellectual Property Office in corresponding Taiwanese Patent Application No. 100122568.

\* cited by examiner

BONDING STRUCTURE MANUFACTURING METHOD, HEATING AND MELTING TREATMENT METHOD, AND SYSTEM THEREFOR

TECHNICAL FIELD

The present invention relates to a bonding structure manufacturing method, a heating and melting treatment method, and a system therefor for bonding multiple bonded members with a heat-melting material such as solder and eutectic-bonding insert metal interposed therebetween.

BACKGROUND ART

Techniques for manufacturing a bonding structure by bonding multiple bonded members with solder or bonding multiple bonded members with eutectic-bonding, with solder such as solder bumps or solder sheet or a eutectic-bonding insert metal interposed therebetween are widely used in semiconductor implementation steps. For example, in a semiconductor implementation step, a technique for bonding an organic substrate and a semiconductor substrate with solder with solder bumps interposed therebetween and a technique for bonding a semiconductor substrate and a semiconductor chip with solder with solder bumps interposed therebetween are employed.

For example, when semiconductor substrates (semiconductor chips) are bonded with solder, it is necessary to remove an oxide film on the surface of the solder bump in order to melt the solder bump and bond multiple substrates with solder. In order to do this, multiple substrates are stacked and heated while a rosin-based reducing organic agent, which is called "flux", is applied to the surface of the substrate. As a result, preferable solder bonding is made while the oxide film on the surface of the solder bump is reduced and removed by the flux. After the solder bonding is made, the flux is removed by cleaning treatment such as solution cleaning and ion etching.

However, in recent years, the decrease in the size of the solder bump structure makes it difficult to remove the flux. In particular, when the pitch interval between adjacent solder bumps or the diameter of the solder bump becomes several dozens of μm or less, it is difficult to sufficiently remove the flux. The flux that could not be removed makes flux residue. Due to the effect of chlorine included in the flux, the flux residue may cause insulation failure, which is called migration, between adjacent electrode structures (solder bumps). In a step of finally filling an underfill resin between substrates, the flux residue makes it impossible to sufficiently fill the underfill resin, which makes clearance that is called void.

On the other hand, a method for omitting cleaning treatment using flux-less solder bonding (cleaning-less method) is actually used as a method for eliminating the effect of the flux residue. More specifically, carboxylic acid vapor such as formic acid is introduced into a chamber, and the oxide film on the surface of the solder bump is reduced by this carboxylic acid, so that this makes it possible to make solder bonding without using any flux (Cited documents 1, 2).

However, flux-less solder bonding raises a new problem in that it is likely to cause positional displacement between substrates. More specifically, as described above, when the flux is used, retaining force (stack force) occurs due to the flux residing between the multiple substrates, and this retaining force prevents the positional displacement of the substrates from one another. In contrast, with the flux-less solder bonding, there is no flux between the substrates, and the retaining force (stack force) cannot be given between the substrates. For this reason, in the cleaning-less method based on the flux-less solder bonding, it is likely to cause positional displacement between substrates, and this imposes limitation on cases where the cleaning-less method can be applied. In particular, when the substrates are bonded with solder with the solder bumps on the substrates, a positioning accuracy may be required to be about 1 to 2 μm, and therefore, it is difficult to apply the cleaning-less method, which is likely to cause positional displacement. Similar problems may occur with eutectic-bonding.

Further, the positional displacement causes the problem not only when the substrates are bonded but also when a solder material is fixed onto a substrate and solder bumps are formed, for example.

CITATION LIST

Patent Literature

Patent Literature 1: Japanese Patent Application Laid-Open No. 11-233934
Patent Literature 2: Japanese Patent Application Laid-Open No. 2001-244618

SUMMARY OF INVENTION

Technical Problem

The present invention is to solve the problem concerning the conventional techniques as described above. More specifically, the present invention is to provide a bonding structure manufacturing method and a manufacturing system capable of alleviating the positional displacement between multiple bonded members even though cleaning treatment can be omitted when a bonding structure is manufactured by bonding multiple bonded members with each other with a heat-melting material interposed therebetween.

In addition, the present invention is to provide a heating and melting treatment apparatus and a heating and melting treatment system capable of alleviating positional displacement in formation of solder when a solder material is subjected to heating and melting treatment and solder formation such as a solder bump is made.

Solution to Problem (1) A bonding structure manufacturing method for manufacturing a bonding structure by bonding a plurality of bonded members with a heat-melting material interposed therebetween includes: a step of preparing the bonded members with the heat-melting material being formed on at least one of the plurality of bonded members; a temporary bonding step for applying an organic agent onto surfaces of the plurality of bonded members facing each other, thereby temporarily bonding the plurality of bonded members with the organic agent interposed therebetween; a bonding step for melting the heat-melting material, thereby bonding the plurality of bonded members with the heat-melting material interposed therebetween; and an evaporation step for evaporating the organic agent by heat application before or after the bonding step.

(2) A bonding structure manufacturing system for manufacturing a bonding structure by bonding a plurality of members with a heat-melting material interposed therebetween includes: an application unit for applying a temporary bonding agent, which is a non-reducing organic agent, onto the bonded members with the heat-melting material being formed on at least one of the plurality of bonded members; a heating unit for heating the plurality of bonded members temporarily bonded while the plurality of bonded members are stacked with the temporary bonding agent interposed therebetween; and a providing unit for providing carboxylic acid vapor to the plurality of bonded members, wherein before the heat-melting material is melted or while the heat-melting material is melted, the heating unit evaporates the temporary bonding agent, and on the other hand, the heating unit heats the bonded members so as to bond the bonded members without flux in an atmosphere including the carboxylic acid vapor.

(3) A heating and melting treatment method for forming a solder by heating a member with a solder material attached and performing heating and melting treatment on the solder material includes: a temporary bonding step for attaching the solder material onto the member, applying an organic agent onto a surface of the member, and temporarily bonding the solder material with the organic agent interposed therebetween; an evaporation step for evaporating the organic agent before the solder material is melted or while the solder material is melted; and a forming step for forming a solder by melting the solder material.

(4) A heating and melting treatment system for forming a solder by heating a member with a solder material attached and performing heating and melting treatment on the solder material includes: an application unit for applying the solder material onto the member, and applying an organic agent onto a surface of the member in order to temporarily bond the solder material; a heating unit for heating the member with the solder material temporarily bonded with the temporary bonding agent interposed therebetween; and a providing unit for providing carboxylic acid vapor to the member, wherein before the solder material is melted or while the solder material is melted, the heating unit evaporates the temporary bonding agent, and on the other hand, the heating unit heats the member so as to form a solder without flux in an atmosphere including the carboxylic acid vapor.

Advantageous Effects of Invention

According to the present invention, when a bonding structure is manufactured by bonding multiple bonded members with each other with solder, the positional displacement between multiple bonded members can be alleviated even though the cleaning treatment can be omitted. When the solder is formed, the positional displacement of the solder material can be alleviated.

DESCRIPTION OF EMBODIMENTS

Figure 1:
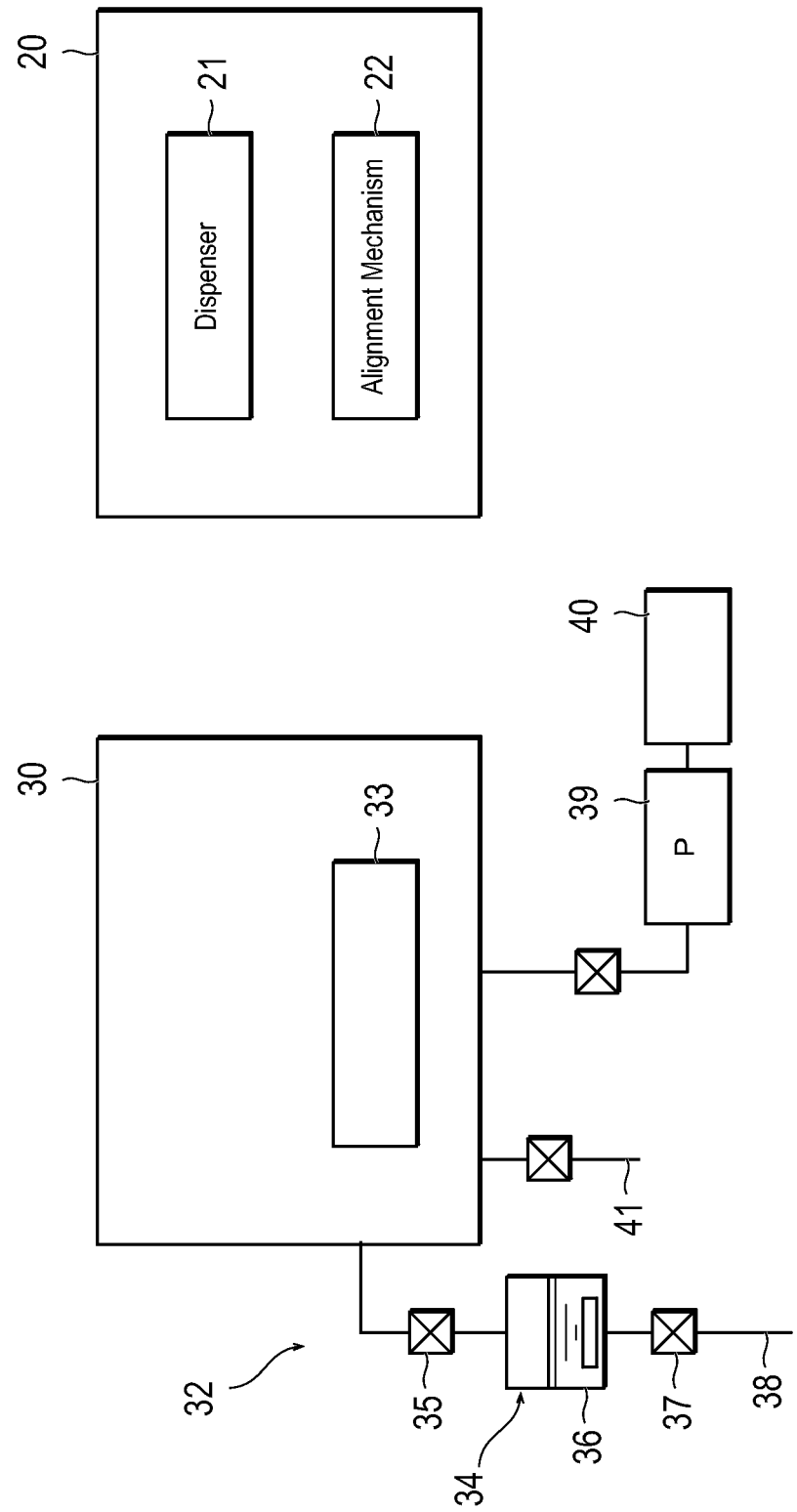
FIG. 1 is a schematic configuration diagram illustrating a bonding structure manufacturing system according to a first embodiment of the present invention.

Embodiments of the present invention will be hereinafter explained with reference to the appended drawings. In the explanation about the drawings, the same elements are denoted with the same reference numerals, and repeated explanation thereabout is omitted. The ratios of the sizes in the drawings are exaggerated for the sake of explanation, and may be different from the actual ratios.

A bonding structure manufacturing technique of the present invention relates to a technique for manufacturing a bonding structure by bonding (in particular, solder bonding or eutectic-bonding) multiple bonded members with a heat-melting member (such as solder or insert metal) interposed therebetween.

First Embodiment

A bonding structure manufacturing technique of the first embodiment of the present invention relates to a technique for manufacturing a bonding structure by bonding multiple bonded members with solder or bonding multiple bonded members with eutectic-bonding. This bonding structure manufacturing technique can also be used for mechanical solder bonding, but preferably, the bonding structure manufacturing technique is a technique for bonding substrates with each other, bonding chips with each other, or bonding a substrate and a chip, with solder bonding, and is to electrically connect electrode structures of a pair of substrates with each other, electrically connect electrode structures of chips with each other, and electrically connect an electrode structure of a substrate and an electrode structure of a chip, with solder bonding.

It should be noted that the substrate may be an organic substrate such as a print substrate, and may be semiconductor substrate and a dielectric substrate such as a silicon substrate or a compound semiconductor substrate. The chip may be a semiconductor chip or a dielectric chip. Hereinafter, an example of a case where semiconductor substrates are bonded with each other with solder bumps interposed therebetween will be explained.

The bonding structure manufacturing technique according to the present embodiment includes forming electrode structures including solder bumps or the like on multiple semiconductor substrates, applying an organic agent onto the semiconductor substrates, and temporarily bonding the substrates with this organic agent. Then, within a chamber, this organic agent is evaporated before the solder is melted or while the solder is melted, so that the organic agent is made into a solder bonding.

In particular, in the present embodiment, although the cleaning-less method based on the flux-less solder bonding is employed to reduce an oxide film of solder by introducing carboxylic acid into the chamber, non-flux organic agent, i.e., a temporary bonding agent which is a non-reducing organic agent, is applied to the substrates and the substrates are temporarily bonded before the substrates are placed into the chamber. As described above, instead of using the flux, a dedicated temporary bonding agent for giving retaining force (stack force) between the substrates is used to prevent positional displacement of the substrates, and meanwhile, before the reducing treatment of the oxide film with the carboxylic acid, or at the same time as the reducing treatment, the temporary bonding agent is evaporated, and thereafter the substrates are bonded with each other.

According to the above configuration, the present invention alleviates positional displacement between multiple bonded members even though the cleaning treatment can be omitted.

FIG. 1 is a diagram illustrating a schematic configuration of a bonding structure manufacturing system according to the present embodiment.

A bonding structure manufacturing system 1 is a substrate soldering system for bonding substrates with each other. When roughly divided, the manufacturing system 1 mainly includes a temporary bonding apparatus 20 and a solder melting apparatus 30.

The temporary bonding apparatus 20 includes a dispenser 21 and an alignment mechanism 22. The dispenser 21 is an application unit for applying a temporary bonding agent, which is a non-reducing organic agent, onto a substrate surface formed with solder such as solder bumps. When the organic agent is applied, the organic agent can be applied on the entire surface of the substrate in a planar manner, or may be applied dispersedly in spots manner. In the present embodiment, however, the organic agent is applied in a planar manner. The alignment mechanism 22 is positioning means for positioning electrode structures of substrates so as to cause the multiple substrates to face each other to sandwich the applied temporary bonding agent, and temporarily bonding the substrates. The temporary bonding apparatus 20 is the same as an apparatus called a flip chip bonder, except that the applied organic agent is not a flux agent, and therefore, the temporary bonding apparatus 20 will not be explained in detail.

On the other hand, the solder melting apparatus 30 includes a chamber 31, a carboxylic acid providing unit 32, and a heater 33 within the chamber 31. Substrates that have been temporarily bonded by the temporary bonding apparatus 20 are conveyed into the chamber 31. The providing unit 32 provides carboxylic acid vapor into the chamber 31 with predetermined timing. However, in some cases, the treatment can be made not in the chamber 31 but in an open environment.

The providing unit 32 includes a carboxylic acid vapor providing system 34 and a valve 35 that is opened and closed with predetermined timing. The providing system 34 mixes carrier gas such as reducing gas such as hydrogen or carbon monoxide or non-oxidizing gas such as nitrogen with carboxylic acid vapor, and introduces the carrier gas mixed with the carboxylic acid vapor into the chamber 31. For example, the providing system 34 includes a sealed container 36 containing carboxylic acid liquid and a carrier gas providing tube 38 providing the carrier gas via a valve 37. The carrier gas providing tube 38 generates bubbles in the sealed container 36 (bubbling). However, the providing unit 32 may be anything as long as it can provide the carboxylic acid into the chamber 31, and it may have a different configuration from the present embodiment.

The heater 33 will be explained. The heater 33 is a heating unit provided in the chamber 31. Before the solder is melted or while the solder is melted, the heater 33 evaporates the temporary bonding agent as well as performs heating treatment in an atmosphere including the carboxylic acid vapor, and heats substrates, which are bonded members, in order to achieve flux-less solder bonding. In particular, before the reducing treatment of the oxide film of the solder with the carboxylic acid or at the same time with the reducing treatment, the heater 33 evaporates the temporary bonding agent. In order to prevent positional displacement of the substrates, it is preferable not to evaporate all the temporary bonding agents before the solder is melted, but when too much temporary bonding agent remains, the surface of the solder cannot be exposed to the carboxylic acid vapor, which makes it difficult to perform the reducing treatment of the oxide film. Therefore, in terms of the reducing treatment, it is desirable to evaporate the temporary bonding agent before the solder is melted.

Further, the solder melting apparatus 30 includes a discharge pump 39 for discharge and a carboxylic acid collecting unit (collecting mechanism) 40 attached or provided at the intake side or the discharge side of the discharge pump 39 so as to collect the vaporized carboxylic acid. The carboxylic acid collecting unit 40 may be a filter attached to the intake side or the discharge side of the discharge pump 39, or may be a scrubber attached to the discharge side. The solder melting apparatus 30 is connected via a valve 42 to a nitrogen providing tube 41 for replacing (purging) the inside with nitrogen atmosphere.

In the solder melting apparatus 30 having the configuration as described above, the substrates temporarily bonded with temporary bonding agent are conveyed into the chamber. Before the solder is melted, in particular, before the reducing treatment of the oxide film of the solder with the carboxylic acid or at the same time with the reducing treatment, the providing unit 32 provides the carboxylic acid vapor and the heater 33 applies heat in accordance with the type of the temporary bonding agent in order to evaporate the temporary bonding agent. Except these features, the detailed configuration is the same as the configuration of a generally-available solder melting apparatus, and detailed description thereabout is omitted.

A conveying robot may be provided to pass substrates between the temporary bonding apparatus 20 and the solder melting apparatus 30.

Subsequently, a bonding structure manufacturing method using the bonding structure manufacturing system according to the present embodiment, i.e., a soldering method, will be explained.

Figure 2:
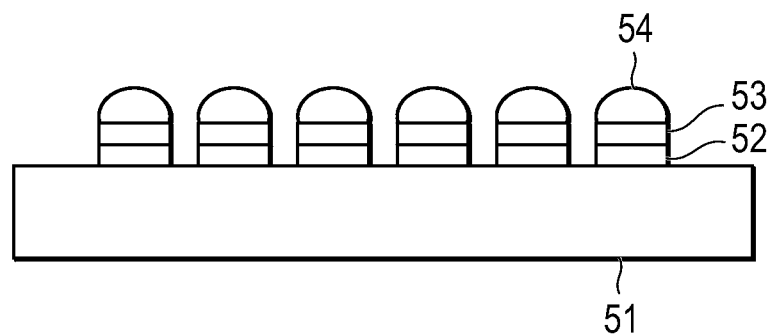
FIG. 2 is a diagram illustrating an example of a substrate used in a bonding structure manufacturing method according to the first embodiment of the present invention.

First, as shown in FIG. 2, substrates 50a, 50b having solder bumps formed on the surface thereof (hereinafter collectively referred to as substrates 50) are prepared. In this case, the substrate 50 is a semiconductor substrate. The substrate 50 includes a semiconductor substrate main body 51 and an electrode structure on the substrate main body 51. More specifically, a copper post 52, a barrier layer 53 on the copper post 52, and a solder bump 54 formed on the barrier layer 53 are provided on the semiconductor substrate main body 51. The copper post 52 is a first protruding portion made of copper (Cu) or copper alloy. The barrier layer 53 is an under barrier metal for preventing solder component from diffusing into the copper post 52 when the solder bump 54 is melted. For example, the barrier layer 53 is a Ni/Pd/Au stacked layer in which nickel (Ni), palladium (Pd), and gold (Au) are stacked in this order from the substrate main body 51. In the case of FIG. 2, the copper post 52 (first protruding portion) is provided as the electrode portion, but the electrode portion is not limited to a protruding form. Moreover, the material thereof is not limited to copper or copper alloy.

The solder bump 54 is formed with lead-free solder such as Sn—Ag (tin-silver) solder that does not include any lead (Pb), lead-including solder such as Pb—Sn solder, or other solder. The formation of the solder bump 54 itself is the same as conventional techniques for forming the solder bump 54 with plating, and therefore, detailed description thereabout is omitted. Unlike the present embodiment, it may be possible to use an insert metal for eutectic-bonding instead of the solder bump 54. In this case, the eutectic-bonding is made such that two types of materials or more are diffused into each other to cause material movement at a treatment temperature and alloy reaction is made, so that the bonding is completed. This is a type of liquid phase diffusion bonding in which an insert metal and the like is temporarily melted and dissolved between surfaces to be bonded and thereafter they are bonded by isothermal solidification using diffusion, and is a bonding method using eutectic reaction on liquefaction.

Figure 3:
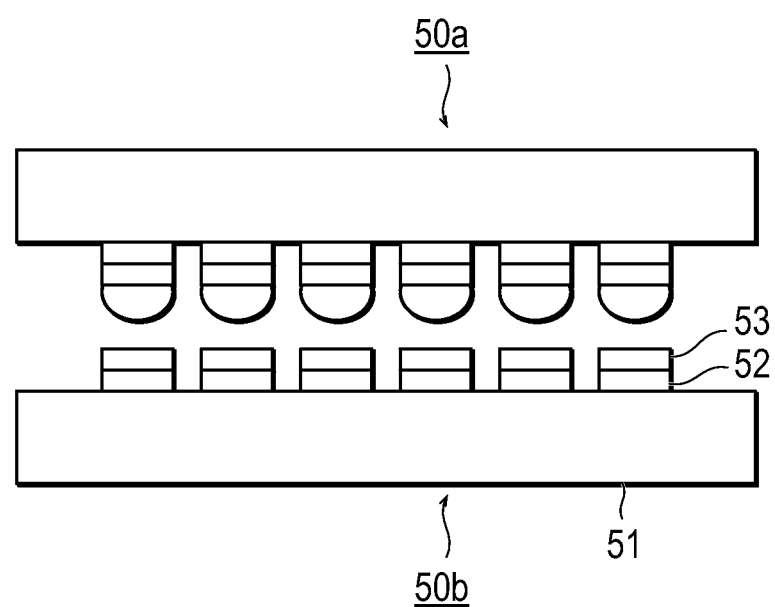
FIG. 3 is a diagram illustrating a first example of a substrate different from FIG. 2.
Figure 4:
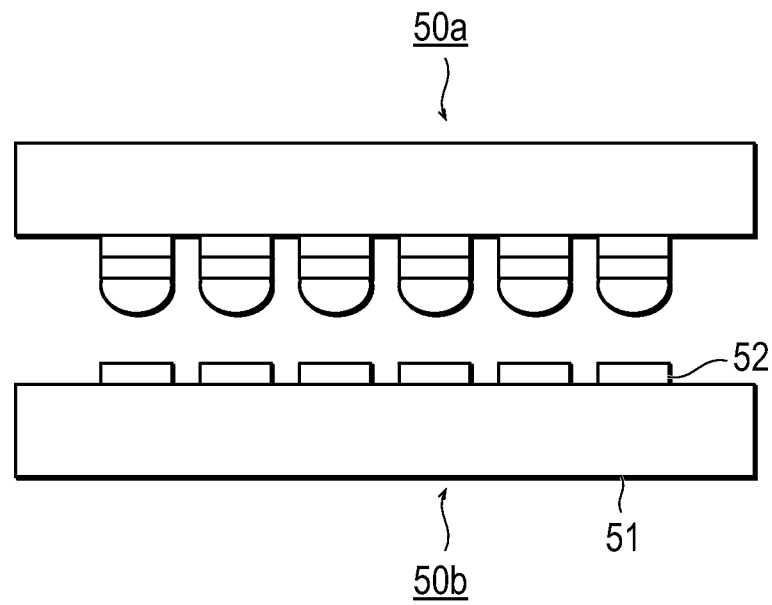
FIG. 4 is a diagram illustrating a second example of a substrate different from FIG. 2.

Both of the pair of prepared semiconductor substrates 50 may be configured as shown in FIG. 2, but the configuration is not limited thereto. For example, the substrate 50a, which is one of the substrates, may be configured to be a substrate including a first electrode portion (for example, copper post) 52, the barrier layer 53, and the solder bump 54, and on the other hand, the substrate 50b, which is the other of the substrates, may be configured to be a substrate without the solder bump 54 as shown in FIGS. 3 and 4 (FIG. 3). The solder bump 54 and the barrier layer 53 may be omitted from the substrate 50b, which is the other of the substrates (FIG. 4). In particular, when both of the solder bump 54 and the barrier layer 53 are omitted from the substrate 50b, which is the other of the substrates, and solder bonding is directly made with the second electrode portion (copper post 52), the substrates can be manufactured with less burden. In the present embodiment, the reducing treatment can be done sufficiently with the carboxylic acid, and therefore, even when the barrier layer and the solder bump are omitted from the substrate 50b, which is the other of the substrates, solder bonding can be directly made with the second electrode portion It should be noted that the bonding structure manufacturing technique according to the present embodiment is preferably used for the substrate 50 provided with multiple solder bumps of which diameter is 100 μm or less while the pitch interval between adjacent solder bumps is 150 μm or less. However, the substrate 50 is not limited to this case.

Figure 5:
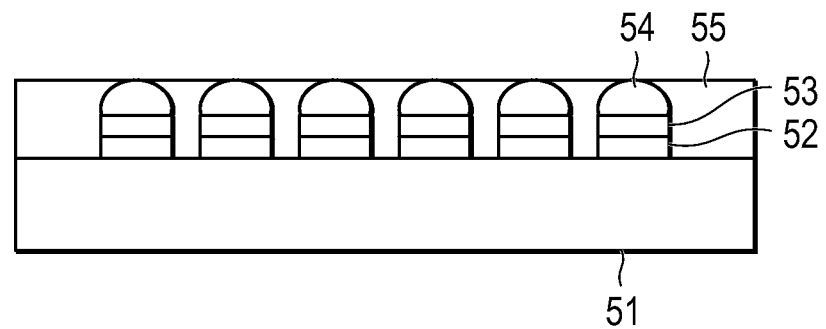
FIG. 5 is a diagram illustrating a subsequent step for the substrate of FIG. 2 according to the first embodiment of the present invention.

Subsequently, as shown in FIG. 5, a temporary bonding agent 55 is applied onto the substrate 50. The temporary bonding agent 55 is applied onto the surfaces of the multiple substrates 50a, 50b facing each other (hereinafter referred to as "bonded surfaces"). The bonded surface corresponds to a surface at a side where an electrode structure such as the solder bump 54 is formed. The temporary bonding agent may be applied to the bonded surfaces of both of the multiple substrates 50a, 50b. Alternatively, the temporary bonding agent may be applied to only the bonded surface of the substrate 50a, which is only one of the substrates. Even when the temporary bonding agent is applied to only the bonded surface of the substrate 50a, which is only one of the substrates, the temporary bonding agent is interposed between the pair of substrates 50a, 50b with the substrate 50a being coming into contact with the substrate 50b, which is the other of the substrates, so that retaining force (stack force) can be given between the substrates 50a, 50b.

In the present embodiment, the temporary bonding agent 55 is applied in a planar manner onto the substrate 50 which is the bonded member. When the temporary bonding agent 55 is applied uniformly in a planar manner as described above, the retaining force (stack force) increases. In the present embodiment, the temporary bonding agent 55 is a non-flux organic agent, i.e., non-reducing organic agent. In other words, in the present embodiment, although the flux-less solder bonding is made, the temporary bonding agent 55 for giving retaining force (stack force) between the substrates is applied, instead of the flux, onto the bonded surfaces of the substrates 50. The reason why the non-reducing organic agent is desirable is because, even if residue of the organic agent remains, insulation failure called migration can be prevented from occurring. More specifically, the temporary bonding agent 55 is desirably an agent that does not include a component such as chlorine that adversely affects the substrate.

The temporary bonding agent 55 may include organic agent and viscosity modifier (thinning liquid). This is to adjust the viscosity. The viscosity of the temporary bonding agent 55 is preferably within a range of 100 to 100000 (30 degrees Celsius mPa·S). More preferably, the viscosity of the temporary bonding agent 55 is within a range of 1600 to 66000 (30 degrees Celsius mPa·S). This is because, when the viscosity is too high, it becomes difficult to apply the agent, and on the other hand, when the viscosity is too low, the retaining force (stack force) between the substrates is low, which does not provide sufficient temporary bonding effect.

As explained later, the temporary bonding agent 55 is selected from a material that evaporates before the solder bump 54 is melted (before reaching the melting point of the solder), when the substrates 50 are heated in the chamber 31. In particular, the temporary bonding agent 55 is selected from a material that evaporates before the reducing treatment of the oxide film of the solder with the carboxylic acid vapor or in parallel with the reducing treatment. More specifically, the boiling point of the temporary bonding agent 55 is set on the basis of the pressure in the chamber 31 before the reducing treatment of the oxide film of the solder and during the reducing treatment and the substrate temperature during the reducing treatment. When the pressure in the chamber 31 is considered, the pressure in the chamber 31 is preferably a pressure of $1\times10^2$ to $1\times10^5$ Pa before the reducing treatment or during the reducing treatment in the present embodiment. The reason why this range is preferable is because, when the pressure is less than $1\times10^2$ Pa, for example, the substrates may be displaced due to bumping of the temporary bonding agent 55, and when the pressure is $1\times10^5$ Pa or more, it is the atmospheric pressure or more. When the range of the substrate temperature is considered, the substrate temperature range during the reducing treatment is desirably 100 degrees Celsius to 350 degrees Celsius. The reason why this kind of temperature range is preferable is because formic acid such as carboxylic acid used for the reducing treatment begins to dissolve at about 350 degrees Celsius, and accordingly, it is desirably 350 degrees Celsius or less, and on the other hand, depending on the type of the solder, reducing treatment may be done at about 100 degrees Celsius with the carboxylic acid vapor. When the pressure range and the substrate temperature range as described above are considered, the temporary bonding agent 55 desirably has a boiling point of 100 degrees Celsius to 350 degrees Celsius at a pressure of $1\times10^2$ to $1\times10^5$ Pa. In general, depending on the type of the material of the solder, it is possible to use a different type of organic agent that evaporates before the reducing treatment or during the reducing treatment (in general, before the solder is melted or while the solder is melted). More specifically, Pb-5Sb solder has a melting point of 314 degrees Celsius, and the solder bonding temperature is about 330 degrees Celsius to about 350 degrees Celsius. Sn-3.5Ag solder has a melting point of 221 degrees Celsius, and the solder bonding temperature is about 230 degrees Celsius to about 250 degrees Celsius. Some solders have melting points lower than that of Sn-3.5Ag solder. Therefore, the temporary bonding agent 55 may be selected depending on the type of the material of the solder.

More specifically, according to the result of experiment, the temporary bonding agent 55 desirably includes at least one non-reducing organic agent selected from isobornyl cyclohexanol, terpineol, and propylene glycol phenyl ether. The isobornyl cyclohexanol (MTPH) has a boiling point of 308 degrees Celsius (5%) 313 degrees Celsius (15%) with the viscosity of 65500 (30 degrees Celsius mPa·S). The terpineol (generic name: pine oil component includes 97% or higher terpin alcohols such as alpha-terpineol, beta-terpineol, and gamma-terpineol, which are isomers, which are the main components) has a viscosity lower than that of the isobornyl cyclohexanol (MTPH), and has a boiling point of 213 to 223 degrees Celsius. The propylene glycol phenyl ether has a viscosity of 22.7 (25 degrees Celsius mPa·S), and has a boiling point of 243 degrees Celsius (760 mmHg). In particular, in a case of Sn—Ag, the isobornyl cyclohexanol (MTPH) is preferable.

The viscosity modifier may be appropriately selected from those of which viscosities are less those of isobornyl cyclohexanol, terpineol, and propylene glycol phenyl ether. For example, 2,4-diethyl-1,5-pentanediol ($C_9H_{20}O_2$) may be used as the viscosity modifier. The ratio of viscosity modifier added to the undiluted solution of the organic material may be selected appropriately, but it may be 0 to 90 weight percent.

It should be noted that the temporary bonding agent 55 may include multiple types of non-reducing organic agents having different boiling points from each other. In this case, at least some of temporary bonding agent components evaporate earlier than other temporary bonding agent components, so that, in a portion where the evaporated temporary bonding agent components existed, the surfaces of the solder bumps are exposed earlier, and the reducing treatment is started, whereby the solder bonding is made earlier. On the other hand, all the temporary bonding agents do not evaporate at a time, and therefore, over a relatively wide temperature range, the temporary bonding effect can be maintained, so that this enhances the effect of preventing the positional displacement. For example, some of the temporary bonding agent components evaporate before the solder is melted, and the other temporary bonding agent components evaporate while the solder is melted, but an agent obtained by mixing these components can be used as the temporary bonding agent 55.

Subsequently, after the temporary bonding agent 55 is applied, the alignment mechanism 22 positions the substrates 50a, 50b with respect to each other by causing the multiple substrates 50a, 50b to face each other to sandwich the temporary bonding agent 55, so that the substrates 50a, 50b are positioned opposite to each other. As a result, the temporary bonding agent 55 gives the retaining force (stack force) between the substrates 50a, 50b, and the substrates 50a, 50b are temporarily bonded to each other.

Figure 6:
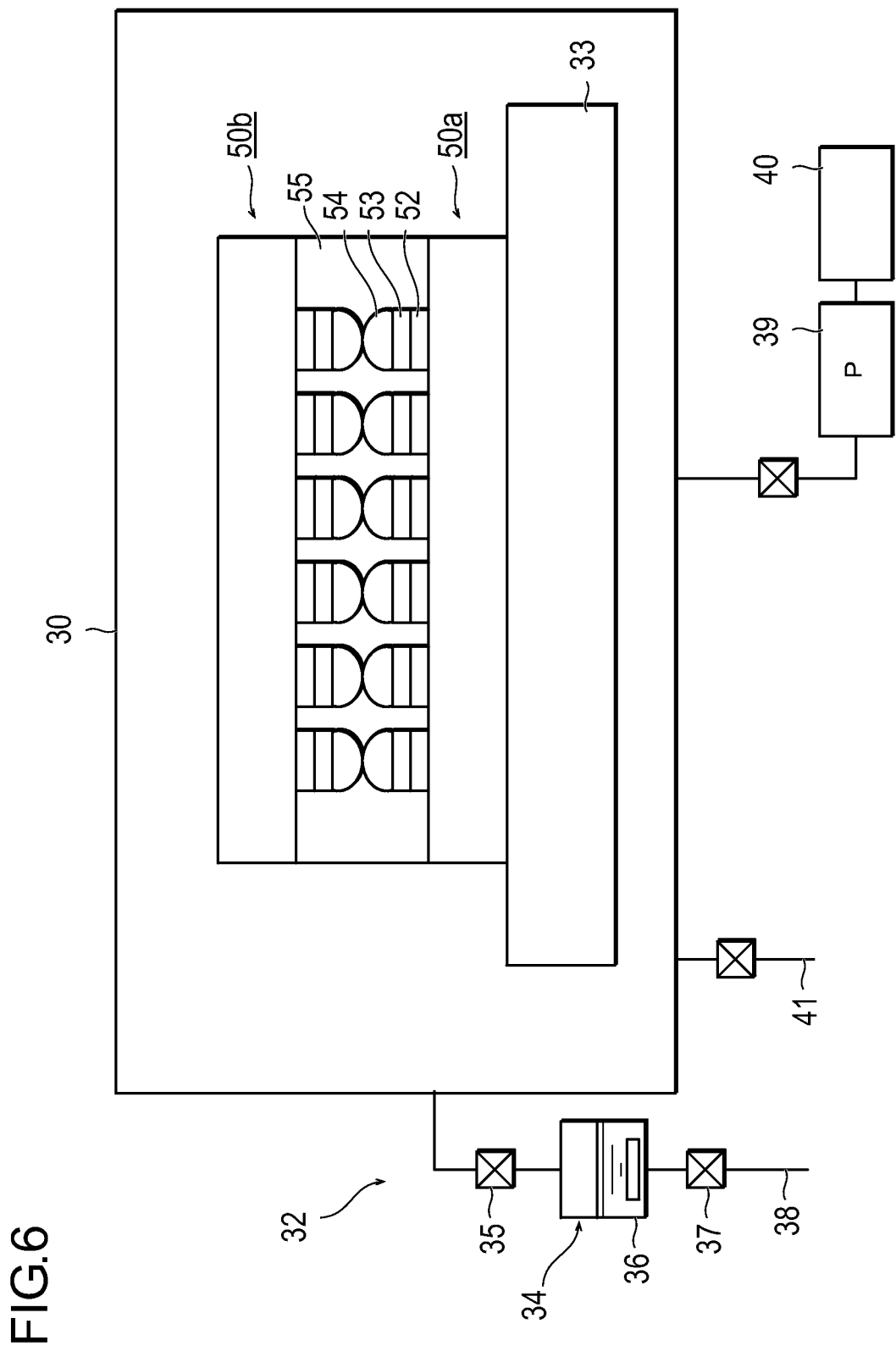
FIG. 6 is a diagram illustrating a step subsequent to FIG. 5 according to the first embodiment of the present invention.

Subsequently, as shown in FIG. 6, the temporarily bonded substrates 50a, 50b are conveyed into the chamber 31. In the chamber 31, the substrates 50a, 50b are arranged on the heater 33 with, for example, a tray (not shown) interposed therebetween. In FIG. 6, the pair of substrates 50a, 50b are shown, but, for example, multiple pairs of substrates, multiple pairs of chips, and multiple sets of substrates and chips may be conveyed as bonded members at a time.

Figure 7:
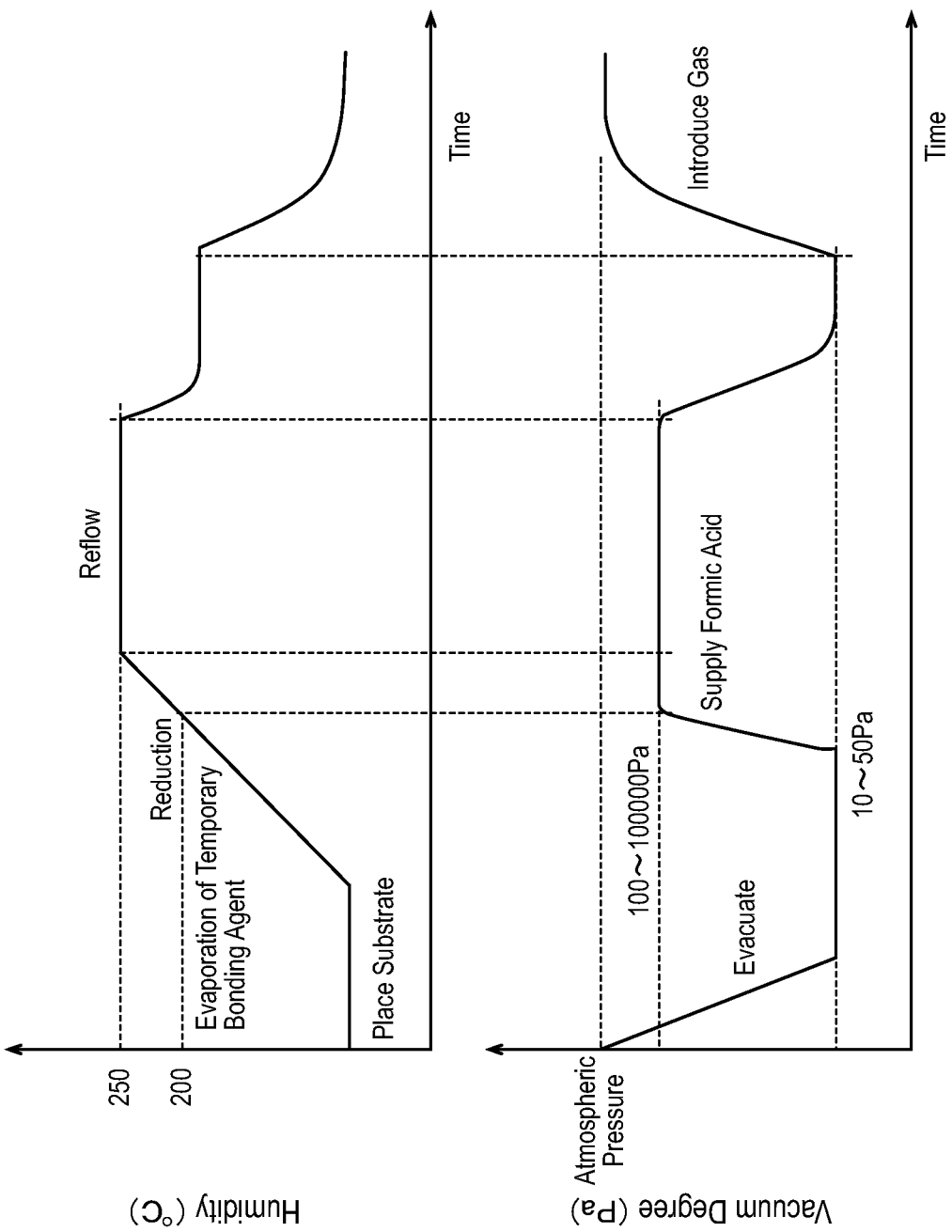
FIG. 7 is a diagram illustrating a temperature condition and a vacuum degree condition according to the first embodiment of the present invention.

Subsequently, process is performed under temperature condition and vacuum degree condition as shown in FIG. 7. First, as shown in FIG. 7, using the pump 39, the chamber 31 is evacuated to about, for example, 10 to 50 Pa. The degree of evacuation is not limited to about 10 to 50 Pa, and may be adjusted as necessary. Then, subsequent to the evacuation processing, or in parallel with the evacuation processing, the substrates 50a, 50b are heated with the heater 33, and the substrate temperature is increased.

Subsequently, the carboxylic acid vapor is introduced into the chamber 31. By providing the carboxylic acid vapor, the chamber 31 is at about 100 to 10000 Pa. The carboxylic acid vapor is desirably introduced at least before the temperature of the substrates 50a, 50b reaches the melting point of the solder. For example, when the solder is Sn-3.5Ag (melting point of 221 degrees Celsius), it is heated to about 230 degrees Celsius to 250 degrees Celsius suitable for soldering, but at about 200 degrees Celsius or higher, the reducing effect of the carboxylic acid is enhanced, and the reducing treatment is started. In a case of Pb-5Sn (melting point of 314 degrees Celsius), it is heated to about 330 degrees Celsius to 350 degrees Celsius suitable for soldering, but at about 250 degrees Celsius or higher, the reducing effect of the carboxylic acid is enhanced, and the reducing treatment is started.

Then, in the present embodiment, before the reducing treatment of the oxide film of the solder with the carboxylic acid vapor or in parallel with the reducing treatment, the temporary bonding agent 55 is evaporated. More specifically, when the solder is Sn-3.5Ag, the reducing treatment is performed at around 200 degrees Celsius, e.g., about 180 degrees Celsius to 250 degrees Celsius, and the solder bonding is made at about 230 degrees Celsius to 250 degrees Celsius, but before this reducing treatment or in parallel with the reducing treatment, the temporary bonding agent 55 is evaporated. Likewise, when the solder is Pb-5Sn, the reducing treatment is performed at around 250 degrees Celsius, e.g., about 220 degrees Celsius to 350 degrees Celsius, and the solder bonding is made at about 330 degrees Celsius to 350 degrees Celsius, but before this reducing treatment or in parallel with the reducing treatment, the temporary bonding agent 55 is evaporated. Even when the solder is made of other materials, before the reducing treatment of the oxide film of the solder with the carboxylic acid vapor or in parallel with the reducing treatment, the temporary bonding agent 55 is evaporated. As shown in FIG. 7, when the evacuation to about 10 to 50 Pa makes it easy to evaporate the temporary bonding agent 55. In other words, it is effective to temporarily enhance the vacuum degree in the chamber 31 so that the temporary bonding agent 55 easily evaporates.

Figure 8:
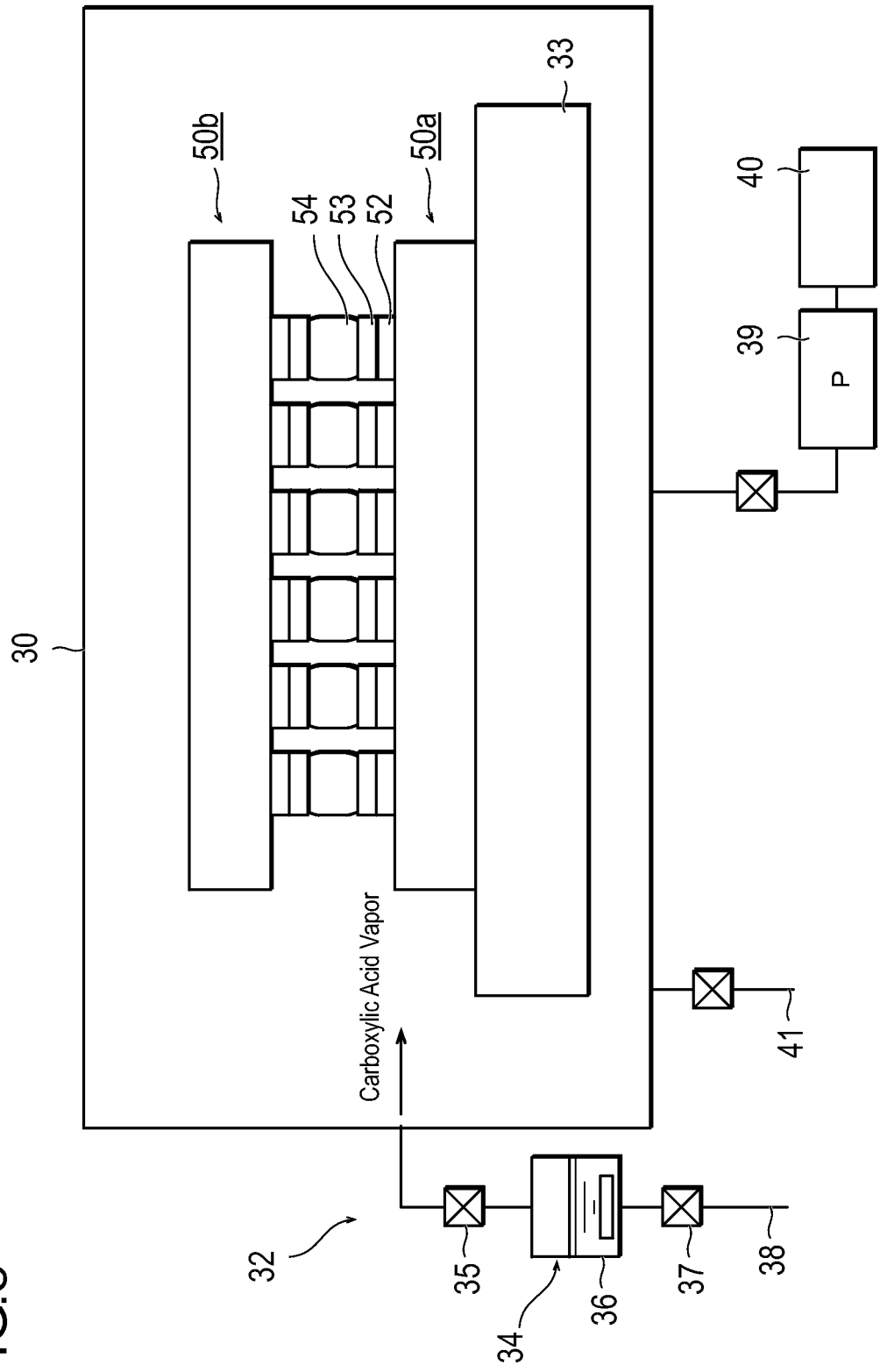
FIG. 8 is a diagram illustrating a step subsequent to FIG. 6 according to the first embodiment of the present invention.

As shown in FIG. 8, as the temporary bonding agent 55 gradually evaporates, the solder bump 54 is gradually exposed to the carboxylic acid vapor. As a result, the oxide film on the surface of the solder bump 54 is reduced.

At this occasion, the temporary bonding agent 55 may include multiple types of non-reducing organic agents having different boiling points from each other. In this case, at least some of temporary bonding agent components evaporate earlier than other temporary bonding agent components. In a portion where the temporary bonding agent components that evaporated earlier existed, the reducing treatment is started earlier, and on the other hand, all the temporary bonding agent components do not evaporate at a time due to the difference of the boiling points, and therefore, the temporary bonding effect can be maintained over a relatively wide temperature range.

Figure 9:
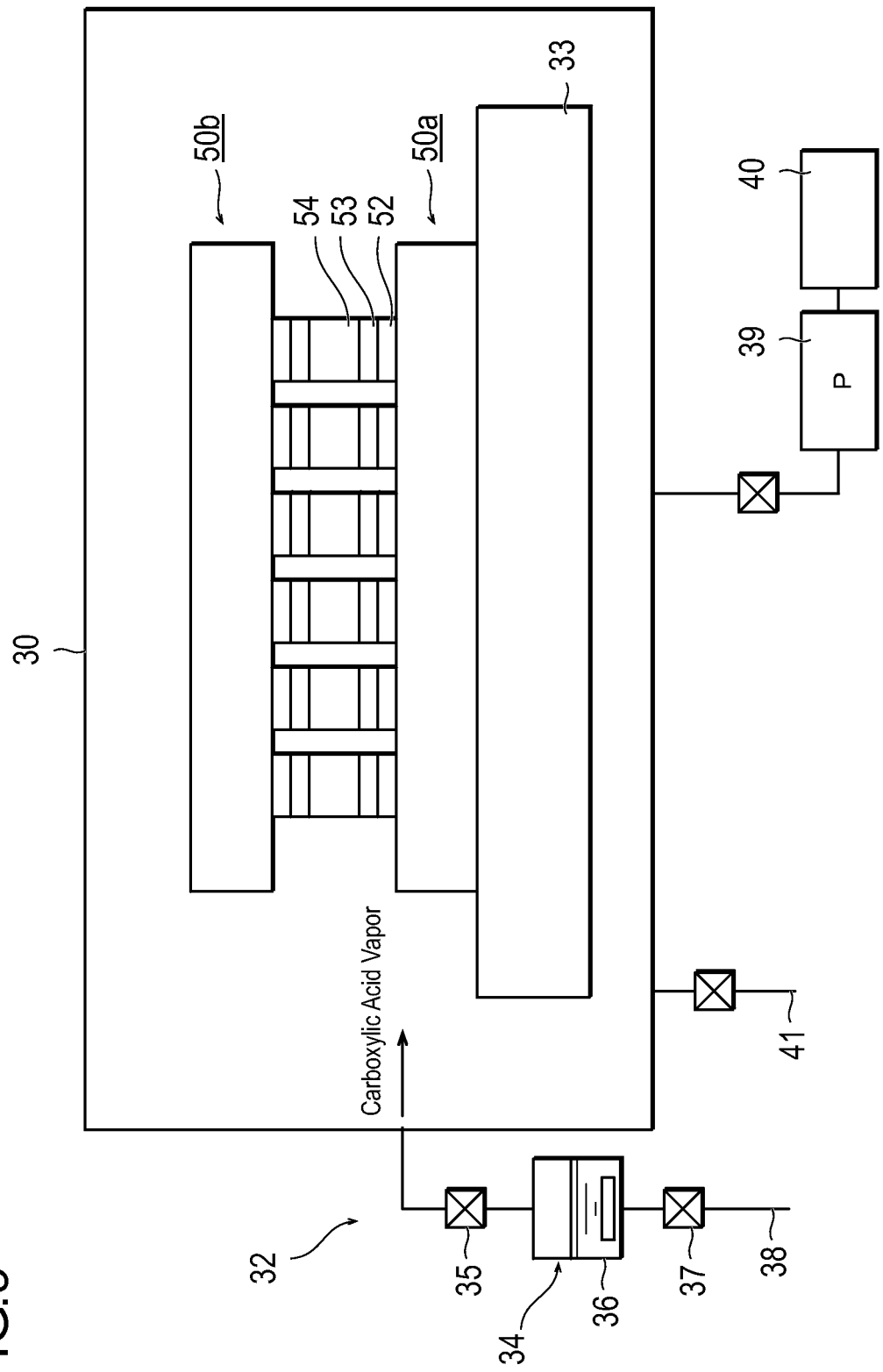
FIG. 9 is a diagram illustrating a step subsequent to FIG. 8 according to the first embodiment of the present invention.

Then, as shown in FIG. 9, the flux-less solder bonding is made. Before the solder bump 54 is melted, a portion or all of the temporary bonding agent 55 may be evaporated, or while the solder bump 54 is melted, the temporary bonding agent 55 may be evaporated. In terms of preventing the positional displacement, the temporary bonding agent 55 is desirably evaporated after the solder bump 54 starts to melt. However, in terms of sufficiently performing reducing treatment by earlier exposing the surface of the solder bump 54 to cause the surface of the solder bump 54 to come into contact with the carboxylic acid vapor, it is desirable to evaporate a portion or all of the temporary bonding agent before the solder bump 54 is melted. More specifically, at least a portion of the temporary bonding agent 55 is evaporated, and the solder bump 54 is exposed, and in this exposed portion, the oxide film is reduced and removed. Even when the temporary bonding agent 55 is completely evaporated before the solder bump 54 is melted, the solder bonding can be made without any positional displacement. Then, when the temperature of the substrates 50a, 50b is a solder bonding temperature (for example, when the solder is Sn-3.5Ag, the solder bonding temperature is about 230 degrees Celsius to 250 degrees Celsius), the solder in that portion is melted and soldered (solder bonding). The temporary bonding agent 55 is completely evaporated, and then the solder bump 54 is completely exposed, and the reducing treatment is performed, so that the solder bonding is completely made by sufficiently melting the solder. At this occasion, the soldering processing (reflow) is completed. If a large positional displacement can be prevented with the temporary bonding agent 55, the positional displacement is thereafter corrected by self-alignment due to the effect of the surface tension of the solder. When the temporary bonding agent 55 is evaporated while the solder 54 is melted, the temporary bonding effect can be maintained until the soldering effect due to the melted solder 54 is caused. Even when the temporary bonding agent 55 is evaporated before the solder 54 is melted, this reduces the time from when the temporary bonding agent 55 is completely evaporated and the temporary bonding effect is lost to when the soldering processing is completed, and therefore, the positional displacement of the substrates 50a, 50b can be prevented or alleviated.

After the soldering processing (reflow), the substrate temperature begins to decrease, and the discharge pump 39 discharges the carboxylic acid vapor. The carboxylic acid collecting unit (collecting mechanism) 40 collects vaporized carboxylic acid. Thereafter, the inside of the chamber 31 is replaced (purged) with gas such as nitrogen introduced from the nitrogen providing tube 41, and thereafter, the bonding structure of which solder bondings have been completed, i.e., the solder-bonded substrates 50, are retrieved.

Figure 10:
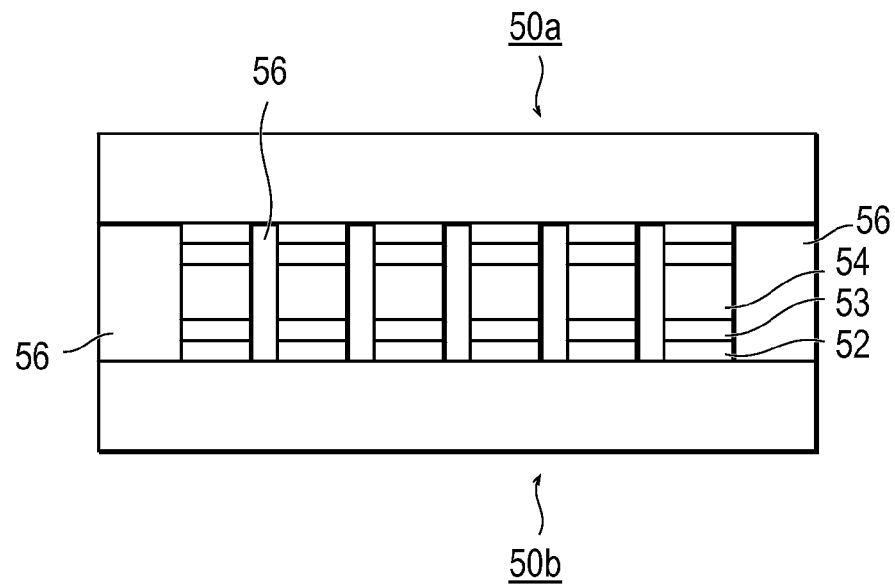
FIG. 10 is a diagram illustrating a step subsequent to FIG. 9 according to the first embodiment of the present invention.

Subsequently, as shown in FIG. 10, after the step of the solder bonding, the underfill resin 56 is filled between multiple substrates, i.e., the substrate 50a and the substrate 50b, for the retrieved substrates 50 of which solder bondings have been made. This is to enhance the pasting strength of the solder-bonded substrates 50 and to protect them. At this occasion, the organic agent (temporary bonding agent) between the substrate 50a and 50b have already been evaporated and removed. Therefore, unlike an ordinary solder bonding using flux, substantially no organic agent exists between the substrates 50a and 50b, and even after cleaning, no residue remains. As a result, in the step of filling the underfill resin between the substrates, generation of clearances called voids caused by insufficient filling of the underfill resin due to the residue can be prevented. Even when the organic agent (temporary bonding agent) does not remain between the substrates and a small amount of temporary bonding agent remains, insulation failure called migration can be prevented because the temporary bonding agent is not rosin reducing organic agent but is non-reducing organic agent.

As illustrated in examples explained below, according to the technique of the present embodiment, when the substrates are bonded that are formed with solder bumps of which diameter is about several dozens of μm or of which pitch is about several dozens of μm, flux-less solder bonding can be made with a positional displacement of 2 μm or less.

The bonding structure manufacturing technique of the first embodiment of the present invention has been explained hereinabove, but the present invention is not limited to this case, and can be changed as necessary.

For example, the temperature condition and the vacuum degree condition are not limited to what is shown in FIG. 7. For example, in order to reduce the process time, it is desired to monotonically increase the substrate temperature from the entry of the substrate to the reflow as shown in FIG. 7, but it is not limited thereto. For example, before the substrate temperature reaches the solder bonding temperature, the reducing treatment may be performed by maintaining the substrate temperature at a temperature lower than the solder bonding temperature by about 50 to 80 degrees Celsius for a certain period of time. Alternatively, the temperature of the substrate may be controlled by conveying the substrates 50a, 50b onto the heater 33 or moving the substrates 50a, 50b out of the heater 33 while the temperature of the heater 33 is maintained at a certain level.

According to the present embodiment, the following effects can be obtained.

(1) The organic agent 55 evaporates before the solder 54 is melted or while the solder 54 is melted, and therefore, after the solder bonding is made, cleaning for removing the organic agent 55 is unnecessary. Therefore, the residue of the organic agent 55 does not remain, and in particular, when the electrode structure of the substrate 50a and the electrode structure of the substrate 50b are bonded with solder, migration and other contaminations do not occur. In addition, in the step of filling the underfill resin into the gap, generation of voids caused by insufficient filling of the underfill resin due to the residue of the organic material can be prevented.

(2) Since the residue of the organic agent 55 does not remain, this can be used for, in particular, the solder bonding of the substrate having the solder bumps 54 of which diameter is about several dozens of μm or less and of which pitch between adjacent solder bumps is about several dozens of μm, and for, in particular, the fine structure of several μm or less.

(3) In particular, the flux-less solder bonding is made using the temporary bonding agent 55 which is non-reducing organic agent as the organic agent. Therefore, even with the flux-less solder bonding, the retaining force (stack force) can be given to the substrates with the temporary bonding agent 55, and the positional displacement can be prevented. Even if a small amount of temporary bonding agent remains, migration and other contaminations do not occur unlike the flux agent.

(4) In particular, before the reducing treatment of the oxide film of the solder 54 with the carboxylic acid vapor or in parallel with the reducing treatment, the temporary bonding agent is evaporated, and therefore, as the temporary bonding agent 55 is gradually evaporated, the solder bump 54 is gradually exposed to the carboxylic acid vapor. Therefore, the temporary bonding agent 55 prevents the positional displacement of the substrates 50a, 50b, whereas this does not block the reducing treatment with the carboxylic acid vapor. Even when the temporary bonding agent 55 is completely evaporated before the solder bump 54 is melted, the solder bonding can be made without positional displacement. More specifically, the positional displacement is prevented while the substrates are conveyed, and with the effect of the surface tension of the solder due to the melted solder bump 54, the substrates are self-aligned, and the positional displacement is corrected.

(5) The vacuum degree in the chamber 31 is temporarily enhanced so that the temporary bonding agent 55 easily evaporates, whereby the temporary bonding agent 55 sandwiched by the substrates 50a, 50b having fine structures (52, 53, 54) is likely to evaporate.

(6) The temporary bonding agent 55 has a boiling point of 100 degrees Celsius to 350 degrees Celsius at a pressure of $1 \times 10^2$ to $1 \times 10^5$ Pa, and therefore during the reducing treatment or immediately before the reducing treatment, the temporary bonding agent 55 remains to give the retaining force, and on the other hand, the reducing treatment is not blocked.

(7) The temporary bonding agent 55 is at least one non-reducing organic agent selected from isobornyl cyclohexanol, terpineol, and propylene glycol phenyl ether, and therefore during the reducing treatment or immediately before the reducing treatment, the temporary bonding agent remains to give the retaining force, and on the other hand, the reducing treatment is not blocked. Materials causing migration and other contaminations are not included. Further, the viscosity is appropriate, and a sufficient retaining force (stack force) can be given.

(8) When the temporary bonding agent 55 includes multiple types of non-reducing organic agents having different boiling points from each other, at least some of temporary bonding agent components evaporate earlier than other temporary bonding agent components, so that, in a portion where the evaporated temporary bonding agent components existed, the reducing treatment can be started earlier. On the other hand, all the temporary bonding agents do not evaporate at a time, and therefore, the temporary bonding effect can be maintained over a relatively wide temperature range, so that the effect of preventing the positional displacement is enhanced.

(9) The temporary bonding agent 55 is diluted by the viscosity modifier so that the viscosity becomes $1 \times 10^2$ to $1 \times 10^5$ mPa·s, and therefore, while this prevents a viscosity that is too high to make application impossible, this can also prevent the viscosity from becoming too low and prevent small retaining force of the substrates.

(10) In particular, this is useful for bonding substrates that are arranged with the solder bumps 54 having diameters of 100 μm or less which are arranged while the pitch interval between adjacent bumps is 150 μm or less.

(11) The present embodiment is of a type using the solder bumps 54, but the oxide film can be reduced sufficiently with the carboxylic acid vapor, and therefore, one of the pair of the substrates 50a, 50b may not have the barrier layer 53 and the solder bump 54, and may have only a copper post (a second protruding portion made of copper) 52 formed thereon, so that solder bonding can be made directly. Accordingly, the substrates 50b can be manufactured with less burden.

(12) In the present embodiment, the temporary bonding agent 55 is applied in a planar manner onto the substrates 50, and therefore, the amount of temporary bonding agent 55 increases, and this increases the retaining force (stack force).

Second Embodiment

Subsequently, the second embodiment of the present invention will be explained. In the first embodiment, a case where the temporary bonding agent is applied in a planar manner onto the substrates has been explained. However, in the second embodiment, the temporary bonding agent is applied in spots manner onto multiple positions. Except this feature, the bonding structure manufacturing technique of the present embodiment is the same as the first embodiment. Accordingly, the same members as the members of the first embodiment are also denoted with the same reference numerals in the present embodiment, and detailed description thereabout is omitted.

In the present embodiment, in the temporary bonding apparatus 20 as shown in FIG. 1, the dispenser 21 dispersedly applies, in spots manner, the temporary bonding agent which is non-reducing organic agent onto the substrate surfaces formed with solder such as solder bump.

Figure 11A:
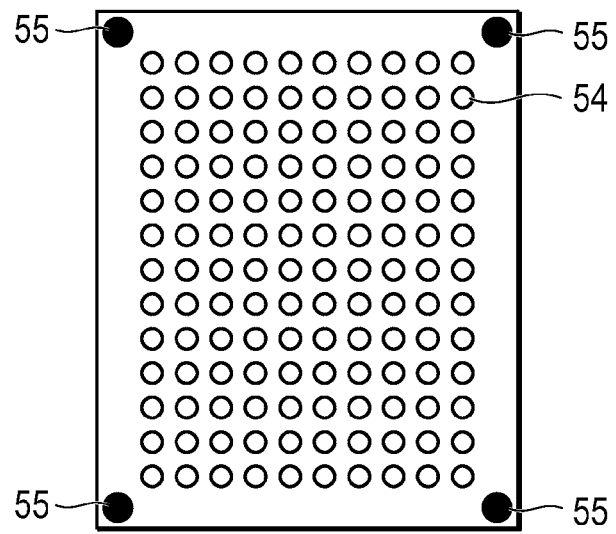
FIGS. 11(*a*) and 11(*b*) are diagrams illustrating an example of application of a temporary bonding agent according to a second embodiment of the present invention.
Figure 11B:
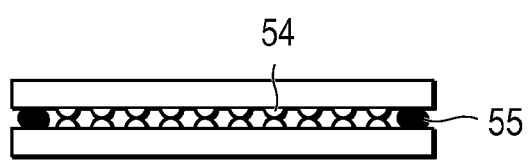
Figure 12:
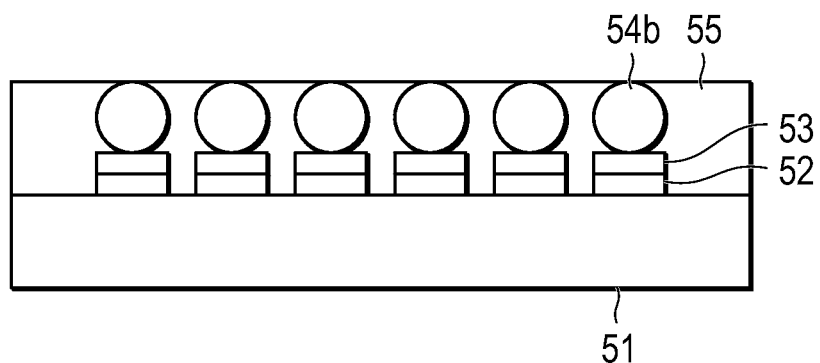
FIG. 12 is a diagram illustrating heating and melting treatment according to a fourth embodiment of the present invention.

FIGS. 11(a) and 11(b) illustrate an example of a case where a temporary bonding agent 55 is dispersedly applied in spots manner. FIG. 11(a) is a top view illustrating a substrate 50a. FIG. 11(b) illustrates substrates 50a, 50b which are temporarily bonded.

In the case as shown in FIGS. 11(a) and 11(b), the temporary bonding agent 55 is applied in spots manner to four corners of a rectangular substrate (chip). When the flux is applied, the flux must be applied to the solder surface so that it comes into contact therewith because it is a primary purpose to reduce and remove the oxide film on the surface of the solder with the flux. However, in the present embodiment, the oxide film on the surface of a solder 54 is reduced with the carboxylic acid vapor, and therefore, the temporary bonding agent 55 is sufficient as long as the temporary bonding agent 55 simply gives the retaining force (stack force) between the substrates. Therefore, the temporary bonding agent 55 need not be applied onto the surface of the solder 54 so that it comes into contact therewith. Therefore, as shown in FIGS. 11(a) and 11(b), the temporary bonding agent 55 may be applied to the surface of the solder 54 so that it does not come into contact therewith.

The type, temperature condition, vacuum degree condition, carboxylic acid gas, solder bump diameter, pitch size, and the like of the temporary bonding agent 55 are the same as those of the first embodiment.

Even when the temporary bonding agent 55 is dispersedly applied in spots manner as described above, the flux-free solder bonding can be made while suppressing the positional displacement of the substrates 50a, 50b. Moreover, since the temporary bonding agent 55 is dispersedly applied in spots manner, the temporary bonding agent 55 can be easily evaporated. In particular, since the temporary bonding agent 55 can be applied without coming into contact with the surface of the solder, the temporary bonding agent 55 does not come into the gaps between the adjacent solder bumps 54, and evaporation and removal can be done easily.

Further, if the effect of the temporary bonding can prevent the position of the solder bump 54 from deviating from the position of the electrode structure (copper post, barrier layer, solder bump of the other substrate, and the like), small positional displacement can be self-aligned with the effect of the surface tension of the solder when the solder bump 54 is melted, so that the positional displacement is corrected. In particular, the effect of self-alignment is high in the present embodiment in which the amount of temporary bonding agent 54 is small.

In the above explanation, the temporary bonding agent 55 is applied in spots manner (dots manner). However, the present embodiment is not limited to this case, and the temporary bonding agent 55 may be applied in a linear manner (line manner). Alternatively, instead of dispersedly applying the temporary bonding agent 55 to multiple spots, the temporary bonding agent 55 may be applied in a spot manner or a line manner.

According to the present embodiment, not only the effects (1) to (12) of the first embodiment but also the following effects can be obtained.

(13) A sufficient amount of retaining force (stack force) can be given to the substrate, and the temporary bonding agent is dispersedly applied in spots manner, and therefore, the temporary bonding agent can be easily evaporated.

(14) In particular, when the temporary bonding agent is applied so as not to be in contact with the surface of the solder, the temporary bonding agent does not enter into the gaps between the solder bumps, and evaporation and removal can be done easily.

Third Embodiment

In the explanation about the above first and second embodiments, the temporary bonding agent which is the non-flux organic agent, i.e., the non-reducing organic agent, is applied as the temporary bonding agent 55 to the substrates, so that the substrates are temporarily bonded.

It is true that in terms of not causing migration and other contaminations even when a very small amount of temporary bonding agent 55 remains without being completely evaporated, it is desirable to use the non-reducing organic agent, which is not the flux agent, as the temporary bonding agent 55, but the present invention is not limited to this case.

More specifically, according to the present invention, multiple bonded members are temporarily bonded with the organic agent interposed therebetween, and then, before the solder is melted, the organic agent is evaporated, and therefore, even if flux agent is used as the organic agent, it is not necessary to provide a step of removing the flux by cleaning treatment such as solution cleaning and ion etching after the solder bonding is made. Therefore, for example, even when the pitch interval between adjacent solder bumps or the diameter of the solder bump 54 is several dozens of μm or less, it is not necessary to consider the issue of the difficulty of removing the flux. Therefore, according to the present invention, even if the flux agent is used, no flux residue is generated after the solder bonding is made, and therefore, insulation failure called migration can be prevented from occurring. Finally, in the step of filling the underfill resin 56 into the substrates, generation of clearances called voids caused by insufficient filling of the underfill resin 56 due to the flux residue can be prevented.

As described above, the present invention can be widely applied, as long as multiple substrates are temporarily bonded with the organic agent interposed therebetween by applying the organic agent to the multiple substrates 50a, 50b so that the organic agent is sandwiched between the multiple substrates 50a, 50b, and the multiple temporarily bonded members are heated, and before the solder is melted or while the solder is melted, the organic agent is evaporated, and the solder is melted in the chamber 31, so that the multiple substrates are bonded with solder with the solder interposed therebetween.

Fourth Embodiment

Subsequently, the fourth embodiment of the present invention will be explained.

In the first to third embodiments, the substrate bonding technique has been explained, but the present invention can also be applied to solder forming techniques. More specifically, the present embodiment relates to a heating and melting treatment method for forming solder bumps on a substrate 50a which is a member with a solder material 54b attached.

The solder material 54b is attached onto the substrate 50a (member), and the temporary bonding agent 55 which is the organic agent is applied onto the surface of the substrate 50a, and the position of the solder material 54b is temporarily bonded with the temporary bonding agent (organic agent) 55 interposed therebetween. Then, the temporary bonding agent 55 is evaporated before the solder material 54b is melted or while the solder material 54b is melted. Then, the solder bumps 54 are formed by melting the solder material 54b. Even in this case, positional displacement of the solder material 54b is prevented.

For this processing a heating and melting treatment system is provided. This system is the same as the system of FIG. 1. The system is a heating and melting treatment system for forming solder by performing the heating and melting treatment on the solder material 54b by heating the member with the solder material 54b attached. Further, the system includes the temporary bonding apparatus 20 for applying the organic agent onto the surface of the member in order to attach the solder material 54b onto the member and temporarily bonding the solder material 54b, a heating unit (solder melting apparatus 30) for heating the member to which the solder material is temporarily bonded, with the temporary bonding agent interposed therebetween, and a providing unit for providing the carboxylic acid vapor to the member, wherein before the solder material is melted or while the solder material is melted, the heating unit evaporates the temporary bonding agent, and heats the member in order to form solder without flux in an atmosphere including the carboxylic acid vapor.

Except these features, it is the same as the first to third embodiments, and detailed description thereabout is omitted.

EXAMPLE

First Example

Substrates 50a, 50b having a copper post 52, a barrier layer (Ni/Pd/Au) 53 on the copper post 52, an Sn—Ag solder bump 54 formed on the bather layer 53 formed on silicon substrates (5 mm square, 25 mm square) were prepared. The pair of substrates 50a, 50b were prepared. It should be noted that the substrates of which diameter of the solder bump 54 was 100 microns and of which pitch between adjacent solder bumps (distance between centers) was 250 microns were used.

The temporary bonding agent was manufactured by diluting the isobornyl cyclohexanol with viscosity modifier (2,4-diethyl-1,5-pentanediol). At this occasion, the example is implemented when the ratio of the viscosity modifier was set at 0 weight percent, 30 weight percent, 50 weight percent, 70 weight percent, and 90 weight percent. The temporary bonding agent 55 was applied in a planar manner onto the pair of substrates 50a, 50b. Then, under the process condition as shown in FIG. 7, the reducing treatment was performed in the formic acid atmosphere, and the flux-less solder bonding was made.

As a result, there was no positional displacement in the substrates 50a, 50b, and solder bonding was made preferably.

On the other hand, when the treatment was performed in nitrogen atmosphere as the comparative example, there was no positional displacement, but the bonding portion of the solder was not formed preferably.

Second Example

Substrates of which diameter of the solder bump 54 was 20 microns and of which pitch between adjacent solder bumps (distance between centers) was 40 microns were used. The other conditions were the same as those of the first example. Even in this case, the positional displacement of the substrates 50a, 50b was 2 µm or less, and the solder bonding was made preferably.

Third Example

The same substrates as the first example were temporarily bonded using the temporary bonding agent manufactured by diluting the terpineol with the viscosity modifier (2,4-diethyl-1,5-pentanediol). The example is implemented when the ratio of the viscosity modifier was set at 0 weight percent, 30 weight percent, 50 weight percent, 70 weight percent, and 90 weight percent. Even in this case, like the first example, the positional displacement was small, and the solder bonding was made preferably. However, the yield slightly decreases as compared with the case of the first example.

Fourth Example

The same substrates as the second example were temporarily bonded using the temporary bonding agent manufactured by diluting the terpineol with the viscosity modifier (2,4-diethyl-1,5-pentanediol). Even in this case, like the second example, the positional displacement was small, and the solder bonding was made preferably. However, the yield was worse as compared with the case of the second example.

Fifth Example

The same substrates as the first example were temporarily bonded using the temporary bonding agent manufactured by diluting the propylene glycol phenyl ether with the viscosity modifier (2,4-diethyl-1,5-pentanediol). The example is implemented when the ratio of the viscosity modifier was set at 0 weight percent, 30 weight percent, 50 weight percent, 70 weight percent, and 90 weight percent. Even in this case, the positional displacement was small, and the solder bonding was made preferably. However, the yield was worse as compared with the case of the first and third examples.

Sixth Example

The same substrates as the second example were temporarily bonded using the temporary bonding agent manufactured by diluting the propylene glycol phenyl ether with the viscosity modifier (2,4-diethyl-1,5-pentanediol). Even in this case, like the second example, the positional displacement was small, and the solder bonding was made preferably. However, the yield was worse as compared with the case of the second and fourth examples.

Seventh Example

The same temporary bonding agent was dispersedly applied in spots manner onto the same substrate as the first example at four locations (four points). At this occasion, with the effect of the temporary bonding by the temporary bonding agent, the positional displacement was alleviated, and the solder bonding could be made. In this example, an experiment was conducted with a sample in which a small positional displacement of about 20 µm between the substrates 50a, 50b was made before the solder bonding was made, but when the effect of the temporary bonding can prevent a large positional displacement, the positional displacement was solved by the self-alignment with the effect of the surface tension of the solder due to the melting of the solder bump 54. Therefore, in practice, this experiment indicates that, by dispersedly applying the temporary bonding agent, the positional displacement between the multiple substrates can be alleviated although the cleaning treatment can be omitted when the soldering substrate is manufactured by bonding multiple substrates with each other with solder.

Eighth Example

The same temporary bonding agent was dispersedly applied in spots manner onto the same substrate as the second example at four locations. Even in this case, the positional displacement between multiple substrates was alleviated.

Ninth Example

A temporary bonding agent manufactured by diluting the terpineol with the viscosity modifier (2,4-diethyl-1,5-pentanediol) at 0% to 90 weight percent was dispersedly applied to four locations in spots manner to the same substrates as the first example. Likewise, the temporary bonding agent was also dispersedly applied to four locations in spots manner to the same substrates as the second example. These also alleviated the positional displacement between the multiple substrates, which was the practical level.

Tenth Example

A temporary bonding agent manufactured by diluting the propylene glycol phenyl ether with the viscosity modifier (2,4-diethyl-1,5-pentanediol) at 0% to 90 weight percent was dispersedly applied to four locations in spots manner to the same substrates as the first example. Likewise, the temporary bonding agent was also dispersedly applied to four locations in spots manner to the same substrates as the second example. These also alleviated the positional displacement between the multiple substrates, which was the practical level.

Hereinabove, embodiments suitable for the present invention have been explained. The present invention is not limited to the above cases, and addition, deletion, change, and the like can be made without deviating from the scope of the claims. In the above explanation, the pair of semiconductor substrates have been explained as the bonding structures, for example. It is to be understood that the bonded structures to which the present invention relates include various kinds of solder-bonded substrates, solder-bonded chips (flip-chip-bonded chips and the like), and one obtained by bonding a substrate and a chip. In the above explanation, use of the solder bumps as solder has been mainly explained. However, the present invention is not limited to the cases.

This application is based on Japanese Patent Application No. 2010-146337 filed on Jun. 28, 2010, and Japanese Patent Application No. 2010-166448 filed on Jul. 23, 2010, and the entire contents of the disclosure are incorporated herein by reference.

REFERENCE SIGNS LIST

1 bonding structure manufacturing system,
20 temporary bonding apparatus,
21 dispenser,
22 alignment mechanism,
30 solder melting apparatus,
31 chamber,
32 providing unit of carboxylic acid,
33 heater, 34 providing system,
35 valve,
36 sealed container,
37 valve,
38 carrier gas providing tube,
39 discharge pump,
40 carboxylic acid collecting unit,
41 nitrogen providing tube,
42 valve,
50 (50a, 50b) semiconductor substrate,
51 semiconductor substrate main body,
52 copper post (first protruding portion),
53 barrier layer,
54 solder bump,
55 temporary bonding agent,
56 underfill resin.

The invention claimed is:

1. A heating and melting treatment method for forming a heat-melting material by heating a member with said heat-melting material attached and performing heating and melting treatment on said heat-melting material, the heating and melting treatment method comprising:
   a temporary bonding step for attaching said heat-melting material onto the member, applying a temporary bonding agent onto a surface of the member, and temporarily bonding said heat-melting material with said temporary bonding interposed therebetween;
   an evaporation step for evaporating said temporary bonding agent by performing heat treatment in an atmosphere including a carboxylic acid vapor in a chamber, before said heat-melting material is melted without flux or while said heat-melting material is melted without flux; and
   a forming step for forming said heat-melting material by melting said heat-melting material,
   wherein in the evaporation step, a vacuum degree in the chamber is temporarily enhanced so that said temporary bonding agent is easily evaporated.

2. The heating and melting treatment method according to claim 1, wherein
   said heat-melting material is a solder material or a eutectic-bonding agent.

3. The heating and melting treatment method according to claim 1, wherein
   said temporary bonding agent is a non-reducing organic agent.

4. The heating and melting treatment method according to claim 3, wherein
   said temporary bonding agent has a boiling point of 100 degrees Celsius to 350 degrees Celsius at a pressure of $1 \times 10^2$ to $1 \times 10^5$ Pa.

5. The heating and melting treatment method according to claim 3, wherein
   said temporary bonding agent is at least one non-reducing organic agent selected from isobornyl cyclohexanol, terpineol, and propylene glycol phenyl ether.

* * * * *